US012660144B2

(12) United States Patent
Liu

(10) Patent No.: US 12,660,144 B2
(45) Date of Patent: Jun. 16, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventor: Chih-Cheng Liu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 442 days.

(21) Appl. No.: 18/364,039

(22) Filed: Aug. 2, 2023

(65) Prior Publication Data

US 2024/0008240 A1    Jan. 4, 2024

Related U.S. Application Data

(63) Continuation of application No. PCT/CN2022/105292, filed on Jul. 12, 2022.

(30) Foreign Application Priority Data

Jun. 29, 2022    (CN) ......................... 202210764449.X

(51) Int. Cl.
*H10B 10/00*        (2023.01)
*H10W 20/41*        (2026.01)
(52) U.S. Cl.
CPC .......... *H10B 10/12* (2023.02); *H10W 20/435* (2026.01)
(58) Field of Classification Search
CPC .. H10B 10/12; H10W 20/435; H10W 20/021; H10W 20/20; H10W 20/427; H10W 20/43
See application file for complete search history.

(56) References Cited

U.S. PATENT DOCUMENTS

| | | | |
|---|---|---|---|
| 11,587,872 B2 | 2/2023 | Liaw | |
| 2011/0235407 A1 | 9/2011 | Lim et al. | |
| 2017/0338233 A1 | 11/2017 | Huang et al. | |
| 2021/0057421 A1* | 2/2021 | Liaw ...................... | H10B 10/12 |
| 2021/0202500 A1 | 7/2021 | Chanemougame et al. | |

FOREIGN PATENT DOCUMENTS

| | | |
|---|---|---|
| CN | 112599527 A | 4/2021 |
| CN | 114497054 A | 5/2022 |
| CN | 114582874 A | 6/2022 |
| WO | 2020255801 A1 | 12/2020 |

OTHER PUBLICATIONS

International Search Report cited in PCT/CN2022/105292 mailed Mar. 20, 2023, 7 pages.

* cited by examiner

*Primary Examiner* — Eduardo A Rodela
(74) *Attorney, Agent, or Firm* — Syncoda LLC; Feng Ma

(57)    ABSTRACT

Embodiments of the present disclosure relate to the semiconductor field, and provide a semiconductor structure and a manufacturing method thereof. The semiconductor structure includes: a substrate, first gates and second gates, and a first conductive channel; where the substrate includes first active regions and two second active regions located between adjacent first active regions, the first active region defines a pull-down transistor, the second active region defines a pull-up transistor; the first active region has a first source region, a first channel region, and a first drain region arranged along a second direction.

16 Claims, 8 Drawing Sheets

SEMICONDUCTOR STRUCTURE AND MANUFACTURING METHOD THEREOF

CROSS-REFERENCE TO RELATED APPLICATIONS

This is a continuation of International Patent Application No. PCT/CN2022/105292, filed on Jul. 12, 2022, which claims priority to Chinese Patent Application No. 202210764449.X, titled "SEMICONDUCTOR STRUC-TURE AND MANUFACTURING METHOD THEREOF" and filed on Jun. 29, 2022. The disclosures of International Patent Application No. PCT/CN2022/105292 and Chinese Patent Application No. 202210764449.X are incorporated herein by reference in their entireties.

TECHNICAL FIELD

Embodiments of the present disclosure relate to the tech-nical field of semiconductors, and in particular to a semi-conductor structure and a manufacturing method thereof.

BACKGROUND

Memory is widely applied to various electronic products as a device for storing information in modern information technologies. The memory can be classified into an internal memory and an external memory according to whether it can be directly read by a central processing unit (CPU). The internal memory can be further classified into a dynamic random access memory (DRAM) and a static random access memory (SRAM).

Data in the SRAM can be stored permanently as long as the SRAM is powered. In case of power-off, the data in the SRAM will disappear. Data in the DRAM needs to be updated periodically.

SUMMARY

Embodiments of the present disclosure provide a semi-conductor structure and a manufacturing method thereof.

According to some embodiments of the present disclo-sure, one aspect of the embodiments of the present disclo-sure provides a semiconductor structure, including: a sub-strate, first gates and second gates, and a first conductive channel extending along the second direction; where the substrate includes first active regions arranged at intervals along a first direction and two second active regions arranged at intervals between adjacent first active regions, the first active regions and the second active regions all extend along a second direction, the first active region defines a pull-down transistor, the second active region defines a pull-up transistor; the first active region has a first source region, a first channel region, and a first drain region arranged along the second direction; and the second active region has a second source region, a second channel region, and a second drain region arranged along the second direc-tion; the first gates and the second gates all extend along the first direction, the first gate covers the first channel region of one of the first active regions and the second channel region of one of the second active regions, and the second gate covers the first channel region of another one of the first active regions and the second channel region of another one of the second active regions; and the first conductive channel is located in the substrate and located between adjacent second active regions, and is configured to electrically connect the second source regions of the adjacent second active regions.

According to some embodiments of the present disclo-sure, another aspect of the embodiments of the present disclosure further provides a manufacturing method of a semiconductor structure, including: providing a substrate, where the substrate includes first active regions arranged at intervals along a first direction and two second active regions arranged at intervals between adjacent first active regions, the first active regions and the second active regions all extend along a second direction, the first active region defines a pull-down transistor, the second active region defines a pull-up transistor; the first active region has a first source region, a first channel region, and a first drain region arranged along the second direction; and the second active region has a second source region, a second channel region, and a second drain region arranged along the second direc-tion; forming a first conductive channel extending along the second direction, where the first conductive channel is located in the substrate and located between adjacent second active regions, and is configured to electrically connect the second source regions of the adjacent second active regions; and forming first gates and second gates, where the first gates and the second gates all extend along the first direc-tion, the first gate covers the first channel region of one of the first active regions and the second channel region of one of the second active regions, and the second gate covers the first channel region of another one of the first active regions and the second channel region of another one of the second active regions.

BRIEF DESCRIPTION OF THE DRAWINGS

One or more embodiments are exemplified by corre-sponding accompanying drawings, and these exemplified descriptions do not constitute a limitation on the embodi-ments. The accompanying drawings are not limited by scale unless otherwise specified. To describe the technical solu-tions in the embodiments of the present disclosure or in the prior art more clearly, the following outlines the accompa-nying drawings to be used in the embodiments of the present disclosure. Apparently, the accompanying drawings outlined below are merely some embodiments of the present disclo-sure. Those of ordinary skill in the art may derive other drawings from the outlined accompanying drawings without making any creative effort.

DETAILED DESCRIPTION

Figure 1:
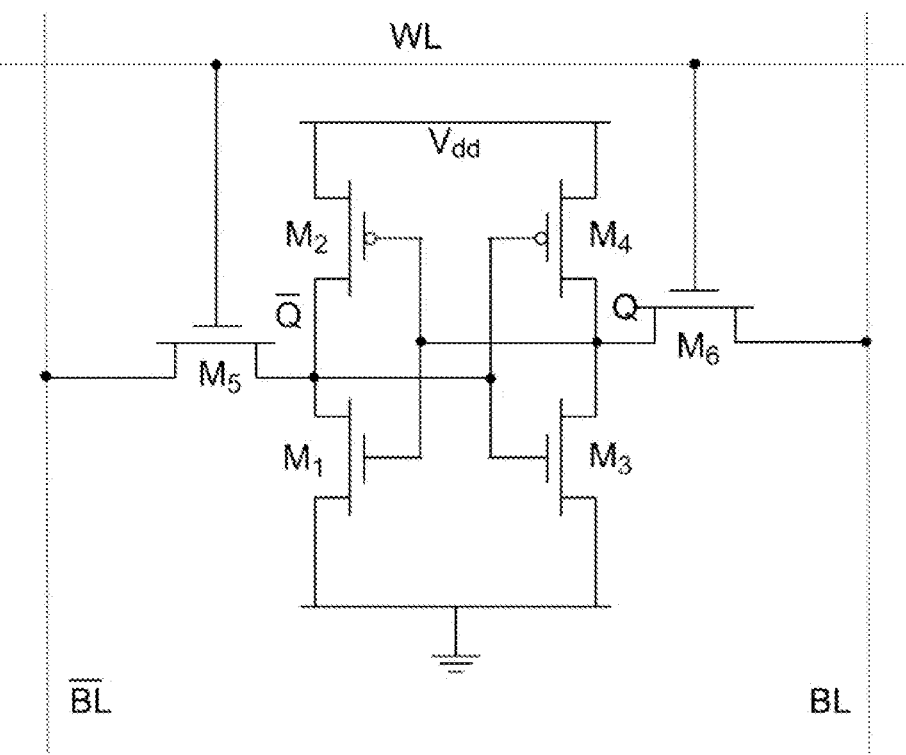
FIG. 1 is a circuit diagram of a semiconductor structure according to an embodiment of the present disclosure.

It is found through analysis that, referring to FIG. 1, an SRAM unit usually includes three states, that is, a read state, a write state, and a hold state. In the read state, it is assumed that when data stored in the SRAM unit is 0, it corresponds to Q=0, and $\overline{Q}$=1, and when data stored in the SRAM unit is 1, it corresponds to Q=1, and $\overline{Q}$=0. It is assumed that, when data currently stored in the SRAM unit is 0, in a reading process, BL and BLB are precharged, that is, BL=BLB=WL=1, Q is at a low potential, $\overline{Q}$ is at a high potential, M4 is turned off, M3 is turned on, M2 is turned on, M1 is turned off, and BLB maintains a voltage unchanged. However, after M3 is turned on, a current is caused to flow from BL to GND. As a result, a potential of BL drops, a voltage of BL is lower than that of BLB, and 0 is read out. Similarly, when data currently stored in the SRAM unit is 1, a voltage of BL is higher than that of BLB, and 1 is read out. In the write state, it is assumed that when data currently stored in the SRAM unit is 0, and 1 needs to be written, BL is precharged, that is, BL=1, BLB=0, and WL=1. In this case, Q is still at a low potential, $\overline{Q}$ is still at a high potential, M4 is turned off, and M3 is turned on. Because the potential of $\overline{Q}$ may drop, as the potential of $\overline{Q}$ drops, M4 is turned on, M3 is turned off. In this way, the potential of Q rises, M1 is turned on, M2 is turned off, the data is flipped, and a write operation is completed. Similarly, it is assumed that when data currently stored in the SRAM unit is 1, and 0 needs to be written, BLB is precharged, that is, BL=0, BLB=1, WL=1, a potential of $\overline{Q}$ rises, a potential of Q drops, the data is flipped, and a write operation is completed. In the hold state, BL=BLB=1, WL=0, and data in the SRAM unit cannot be modified.

BL represents a bit line. BLB represents a complementary bit line. WL represents a word line. M1 represents a first pull-down transistor. M2 represents a first pull-up transistor. M3 represents a second pull-down transistor. M4 represents a second pull-up transistor. M5 represents a first memory transistor. M6 represents a second memory transistor. M1, M3, M5, and M6 are each an NMOS transistor. M2 and M4 are each a PMOS transistor. Q is a first node. $\overline{Q}$ is a second node.

In the embodiments of the present disclosure, a first conductive channel is arranged in a substrate, and the first conductive channel is electrically connected to a second source region of a second active region, such that a quantity of corresponding wiring lines can be reduced during subsequent wiring, and layout spaces for other connection lines can be increased. For example, a space for subsequently forming word lines can be increased and a resistance of the word lines can also be reduced, thereby improving a conduction rate of the word lines.

The embodiments of the present disclosure are described in detail below with reference to the accompanying drawings. However, those of ordinary skill in the art can understand that many technical details are proposed in the embodiments of the present disclosure to help readers better understand the present disclosure. However, even without these technical details and various changes and modifications made based on the following embodiments, the technical solutions claimed in the present disclosure may still be realized.

Figure 2:
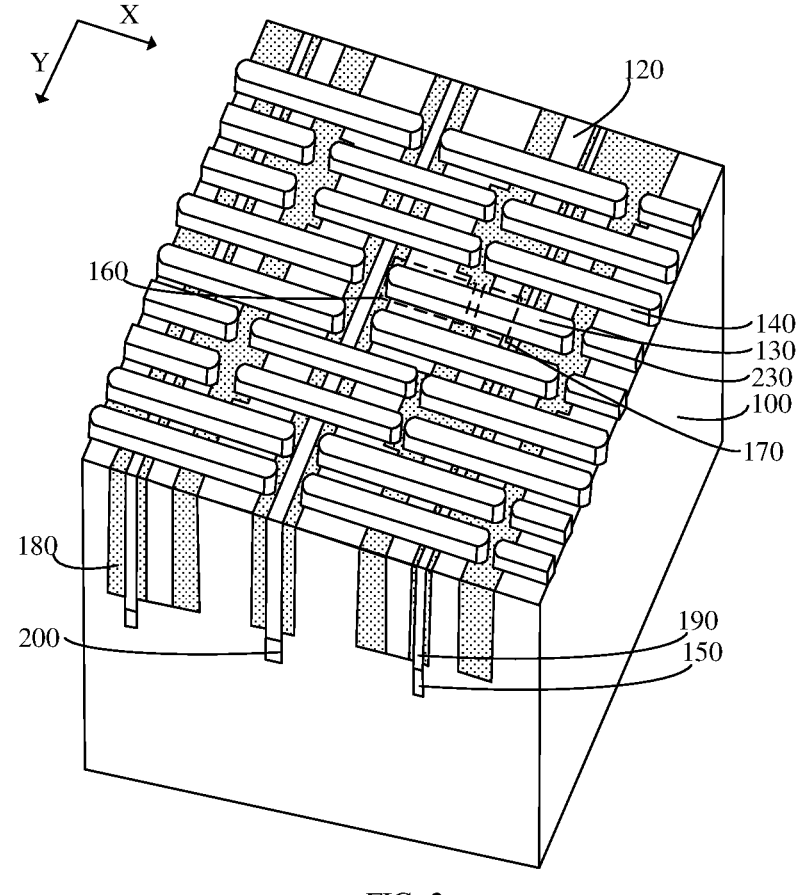
FIG. 2 is a schematic structural diagram of a semicon-ductor structure according to an embodiment of the present disclosure.
Figure 3:
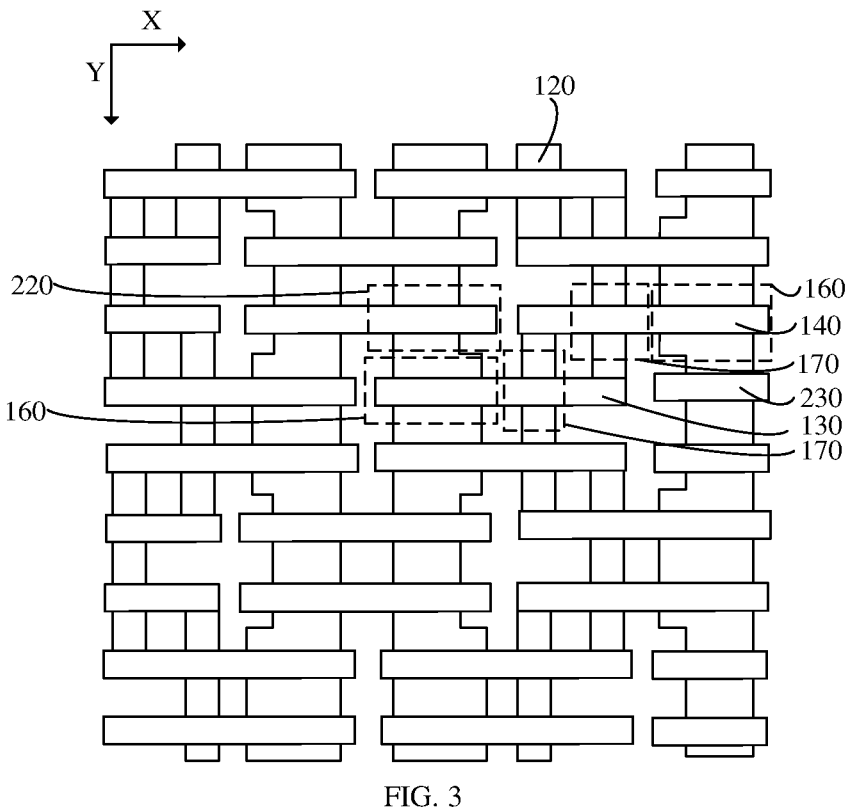
FIG. 3 is a top view of a semiconductor structure accord-ing to an embodiment of the present disclosure.
Figure 4:
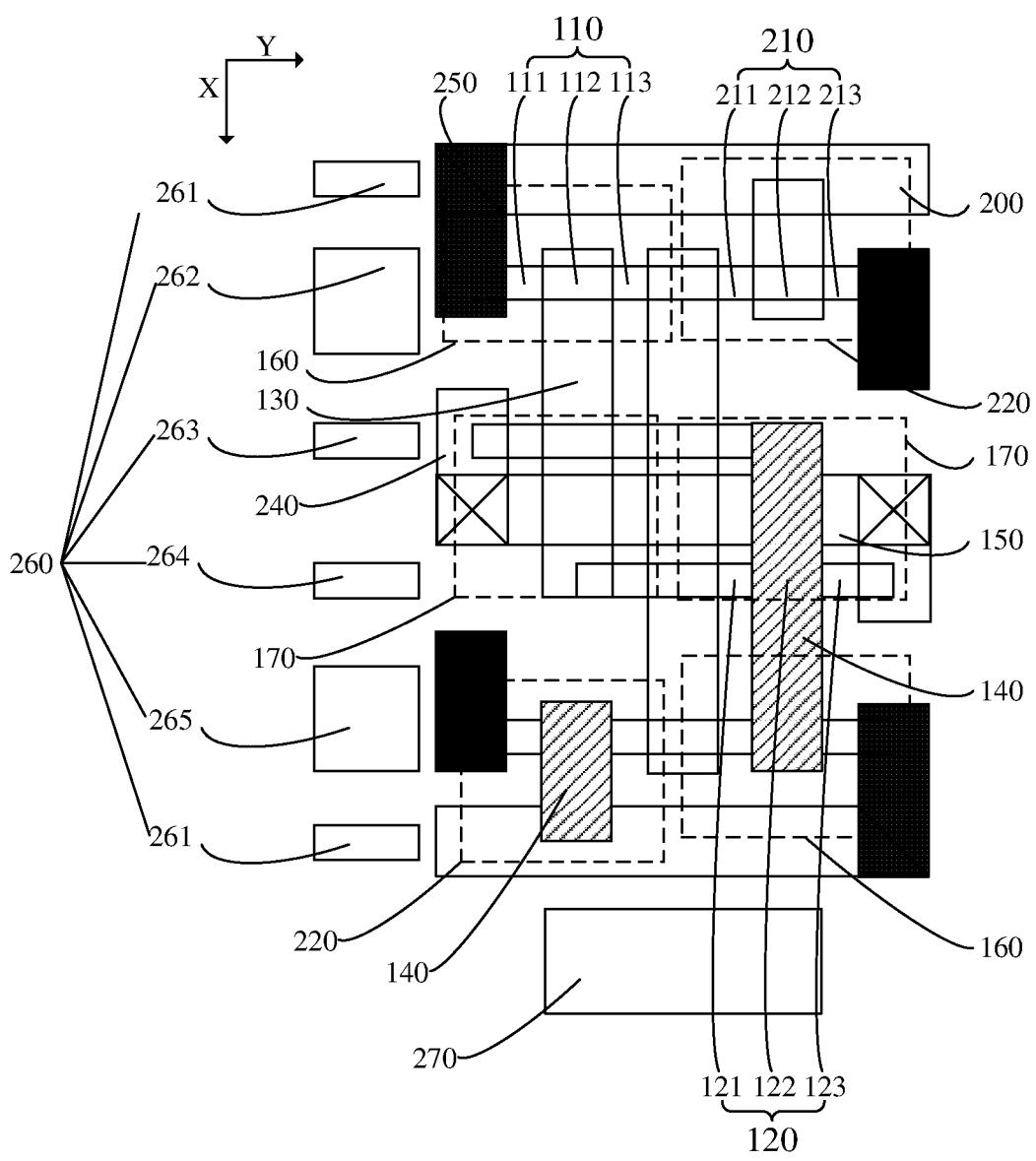
FIG. 4 is a schematic structural diagram of a layout of a semiconductor structure according to an embodiment of the present disclosure.

Referring to FIG. 2 to FIG. 4, FIG. 2 is a schematic structural diagram of a semiconductor structure according to an embodiment of the present disclosure, FIG. 3 is a top view of a semiconductor structure according to an embodiment of the present disclosure, and FIG. 4 is a schematic structure diagram of a layout of a semiconductor structure according to an embodiment of the present disclosure.

The semiconductor structure includes: a substrate 100, first gates 130 and second gates 140, and a first conductive channel 150 extending along the second direction Y; where the substrate 100 includes first active regions 110 arranged at intervals along a first direction X and two second active regions 120 arranged at intervals between adjacent first active regions 110, the first active regions 110 and the second active regions 120 all extend along a second direction Y, the first active region 110 defines a pull-down transistor 160, the second active region 120 defines a pull-up transistor 170; the first active regions 110 each have a first source region 111, a first channel region 112, and a first drain region 113 arranged along the second direction Y; and the second active regions 120 each have a second source region 121, a second channel region 122, and a second drain region 123 arranged along the second direction Y; the first gates 130 and the second gates 140 all extend along the first direction X, the first gate 130 covers the first channel region 112 of one of the first active regions 110 and the second channel region 122 of one of the second active regions 120, and the second gate 140 covers the first channel region 112 of another one of the first active regions 110 and the second channel region 122 of another one of the second active regions 120; and the first conductive channel 150 is located in the substrate 100 and located between adjacent second active regions 120, and is configured to electrically connect the second source regions 121 of the adjacent second active regions 120. The arrangement of the first conductive channel 150 located in the substrate 100 can reduce a wiring space for a supply voltage during subsequent wiring, and a space originally used for wiring for the supply voltage can be used for the layout of another structure. In terms of word lines, for example, a layout space of the word lines can be increased, such that a resistance of the word lines can be reduced, and a capability of the word lines to transfer an electrical signal can be improved, thereby reducing a delay of the semiconductor structure.

In some embodiments, the semiconductor structure further includes: an isolation structure 180. Through the arrangement of the isolation structure 180, the first active region 110 and second active region 120 adjacent to each other can be isolated, thereby avoiding direct contact between the first active region 110 and the second active region 120. In addition, the semiconductor structure can be filled by the isolation structure 180, such that a subsequent production process can be facilitated, and the subsequent formation of a structure on the isolation structure 180 can be supported.

In some embodiments, the semiconductor structure may further include: a conductive layer 190. The conductive layer 190 is located on a top surface of the first conductive channel 150. In addition, the first conductive channel 150 can be led out of a surface of the substrate 100 through the conductive layer 190, and an electrical signal can be provided to the first conductive channel 150 through the conductive layer 190. For example, a supply voltage can be provided to the first conductive channel 150 through the conductive layer 190.

In some embodiments, a material of the substrate 100 may be silicon, germanium, silicon germanium, or the like, and the material of the substrate 100 may also be doped. For example, if the material of the substrate 100 is silicon, the substrate 100 may be doped with a small amount of trivalent elements, such as boron, indium, gallium, or aluminum, to form a P-type substrate. Similarly, the substrate 100 may be doped with a small amount of pentavalent elements, such as phosphorus, antimony, or arsenic, to form an N-type substrate. Doped elements of the substrate 100 may be selected according to actual requirements and product performance.

The material of the substrate 100 and the doped elements are not limited in the embodiments of the present disclosure.

In some embodiments, a structure of the first active region 110 may be different from that of the second active region 120. The first active region 110 may be a continuous film along the second direction Y. The second active region 120 may be a plurality of spaced films along the second direction Y.

In some embodiments, the pull-down transistor 160 includes first pull-down transistors and second pull-down transistors. The first pull-down transistors and the second pull-down transistors are distributed at intervals along the first direction X and the second direction Y, and the first pull-down transistors and the second pull-down transistors are center-symmetrically distributed. Through the center-symmetrical arrangement of the first pull-down transistors and the second pull-down transistors, the semiconductor structure can still be used after being rotated by 180°, thereby improving the versatility of the semiconductor structure.

In some embodiments, the first pull-down transistor includes: the first gate 130, the first channel region 112 of the first active region 110 that is covered by the first gate 130, and the first source region 111 and the first drain region 113 located on two sides of the first channel region 112. The second pull-down transistor includes: the second gate 140, the first channel region 112 of the another first active region 110 that is covered by the second gate 140, and the first source region 111 and the first drain region 113 located on two sides of the first channel region 112.

The first gate 130 covering the first active region 110 is used as a gate of the first pull-down transistor. The first source region 111 and the first drain region 113 located on the two sides of the first gate 130 are used as a source and a drain of the first pull-down transistor, respectively. The second gate 140 covering the first active region 110 is used as a gate of the second pull-down transistor. The first source region 111 and the first drain region 113 located on the two sides of the second gate 140 are used as a source and a drain of the second pull-down transistor.

In some embodiments, the pull-up transistor 170 includes first pull-up transistors and second pull-up transistors. The first pull-up transistor includes the first gate 130 and the second active region 120 covered by the first gate 130. The second pull-up transistor includes the second gate 140 and the second active region 120 covered by the second gate 140. The first pull-up transistors and the second pull-up transistors are center-symmetrically distributed. Through the center-symmetrical arrangement of the first pull-up transistors and the second pull-up transistors, versatility of the semiconductor structure can be improved.

The first gate 130 covering the second active region 120 is used as a gate of the first pull-up transistor. The second source region 121 and the second drain region 123 located on two sides of the first gate 130 are used as a source and a drain of the first pull-up transistor. The second gate 140 covering the second active region 120 is used as a gate of the second pull-up transistor. The second source region 121 and the second drain region 123 located on two sides of the second gate 140 are used as a source and a drain of the second pull-up transistor.

In some embodiments, the first gate 130 and the second gate 140 are respectively located on the top surface of the first active region 110 and the top surface of the second active region 120, and the first gate 130 and the second gate 140 are respectively in contact with the first active region 110 and the second active region 120.

In some embodiments, a top surface of the first conductive channel 150 is lower than a bottom surface of the second active region 120. Setting the top surface of the first conductive channel 150 to be lower than the bottom surface of the second active region 120 can avoid that the interval between the first conductive channel 150 and the second active region 120 adjacent to the first conductive channel 150 is too small, thereby preventing the first conductive channel 150 and the second active region 120 from being electrically connected to each other or suffering from electrical signal interference. In some other embodiments, a top surface of the first conductive channel may be flush with or above a bottom surface of the first active region. A height of the first conductive channel 150 is not limited in the present disclosure, and may be adjusted according to actual requirements.

In some embodiments, a material of the first conductive channel 150 may be tungsten and other conductive materials.

In some embodiments, a diffusion barrier layer (not shown in the figure) may be further included. The diffusion barrier layer is located between the first conductive channel 150 and the substrate 100, and is used to avoid diffusion of metal ions from the first conductive channel 150 to the substrate 100 to contaminate the substrate 100, avoid the performance degradation of the substrate 100, and improve the reliability of the semiconductor structure.

In some embodiments, a material of the isolation structure 180 may be an insulating material such as silicon oxide or silicon oxynitride.

In some embodiments, the semiconductor structure may further include: a second conductive channel 200. The second conductive channel 200 extends along the second direction Y, and the second conductive channel 200 is located on an outer side of the first active region 110 away from the second active region 120 and is configured to electrically connect the first gate 130. Through the arrangement of the second conductive channel 200, a wiring space required for subsequent formation of a semiconductor structure can be reduced. Through the arrangement of the second conductive channel 200, a space used for the layout of a grounding conductor can be used for the layout of another structure. In terms of bit lines, for example, a space for the subsequent layout of the bit lines can be increased, areas of the bit lines can be increased, and a resistance of the bit lines can be reduced by increasing the areas of the bit lines. In addition, a capability of the bit lines to transfer an electrical signal can be improved, thereby reducing a delay of the semiconductor structure.

In some embodiments, the second conductive channel 200 and the first conductive channel 150 may be formed in the same process, and a material of the second conductive channel 200 may be the same as that of the first conductive channel 150.

In some embodiments, a top surface of the second conductive channel 200 is lower than a bottom surface of the first active region 110. Setting the second conductive channel 200 to be lower than the bottom surface of the first active region 110 can avoid that the interval between the second conductive channel 200 and the first active region 110 adjacent to the second conductive channel 200 is too small, thereby preventing the second conductive channel 200 and the first active region 110 from being electrically connected to each other or suffering from electrical signal interference. In some other embodiments, a top surface of the second conductive channel may be flush with or above a bottom surface of the first active region. A height of the second conductive channel 200 is not limited in the present disclosure, and may be adjusted according to actual requirements.

In some embodiments, the semiconductor structure further includes: third active regions 210, and third gates 230; where the third active regions 210 extend along the second direction Y and are arranged at intervals along the first direction X, the third active region 210 is connected to the first active region 110, the third active region 210 defines a memory transistor 220; and the third active regions 210 each have a third source region 211, a third channel region 212, and a third drain region 213 arranged along the second direction Y; and the third gate 230 covers the third channel region 212.

The third source region 211 of the third active region 210 is used as a source of the memory transistor 220. The third drain region 213 is used as a drain of the memory transistor 220. The third gate 230 covering the third channel region 212 is used as a gate of the memory transistor 220. A bit line voltage can be accessed through the memory transistor 220.

In some embodiments, the drain of the memory transistor 220 and the source of the first pull-down transistor are connected to each other, and share an active region.

In some embodiments, the pull-down transistor 160 and the pull-up transistor 170 constitute a common gate structure. In other words, the first pull-down transistor and the first pull-up transistor share the first gate 130 to form a common gate structure. The second pull-down transistor and the second pull-up transistor share the second gate 140 to form a common gate structure. Setting the pull-down transistor 160 and the pull-up transistor 170 to form a common gate structure can improve structural density of the semiconductor structure.

In some embodiments, the second source region 121 of the first pull-up transistor and the second gate 140 of the second pull-up transistor are connected to each other. The second drain region 123 of the second pull-up transistor and the first gate 130 of the first pull-up transistor are connected to each other.

In some embodiments, two of the first active regions 110 arranged at intervals, two of the second active regions 120 between the two first active regions 110, two of the third active regions 210, two of the first gates 130, two of the second gates 140, and two of the third gates 230 constitute a static memory cell, and the static memory cells arranged along the second direction Y share the first conductive channel 150. In other words, two of the memory transistors 220, two of the pull-down transistors 160, and two of the pull-up transistors 170 constitute a static memory cell, and the static memory cells arranged along the second direction share the first conductive channel 150. Setting the static memory cells arranged along the second direction to share the first conductive channel 150 can reduce a quantity of first conductive channels 150 arranged, thereby reducing a space that needs to be occupied for arranging the first conductive channels 150, and improving the structural density of the semiconductor structure.

In some embodiments, one of the first gates 130 and one of the second gates 140 are further included between the static memory cells arranged along the second direction X.

In some embodiments, distances from the first conductive channel 150 to two of the first active regions 110 adjacent to the first conductive channel 150 are equal. In other words, distances from projection of the first conductive channel 150 on the surface of the substrate 100 to projection of each of the two of the first active regions 110 adjacent thereto on the surface of the substrate 100 are equal. Setting the distances from the first conductive channel 150 to the two of the first active regions 110 adjacent to the first conductive channel 150 to be equal can improve the stability of the semiconductor structure and the appearance of the semiconductor structure.

In some other embodiments, alternatively, the distances from the first conductive channel to the two of the first active regions adjacent to the first conductive channel may not be equal. This may be adjusted according to an actual production status and an actual requirement.

In some embodiments, the semiconductor structure further includes: an interconnect layer 240, and a conductive plug 250; where the interconnect layer 240 is located above the substrate 100; and the conductive plug 250 is located between the interconnect layer 240 and the first conductive channel 150, and is configured to electrically connect the first conductive channel 150 and the interconnect layer 240. The first conductive channel 150 may be led out through the conductive plug 250 and in contact with and electrically connected to the interconnect layer 240 through the conductive plug 250. A corresponding electrical signal can be subsequently provided to the interconnect layer 240, and the electrical signal is transferred to the conductive layer 190 through the conductive plug 250 and subsequently provided to the first conductive channel 150, such that the first conductive channel 150 provides the corresponding electrical signal to the second source region 121.

In some embodiments, a material of the interconnect layer 240 may be a metallic material. In some other embodiments, the material of the interconnect layer may alternatively be other conductive materials.

In some embodiments, the conductive plug 250 is further located between the interconnect layer 240 and the second conductive channel 200, and is configured to electrically connect the second conductive channel 200 and the interconnect layer 240. Connecting the second conductive channel 200 to the interconnect layer 240 through the conductive plug 250 can provide a corresponding electrical signal to the interconnect layer 240.

In some embodiments, the semiconductor structure further includes a first wiring layer 260. The first wiring layer 260 includes: a first word line layer 261, a bit line layer 262, a first node layer 263, a second node layer 264, and a complementary bit line layer 265. The first wiring layer 260 is located above the interconnect layer 240.

In some embodiments, the semiconductor structure further includes a second wiring layer 270. The second wiring layer 270 may be used for forming a word line.

In this embodiment of the present disclosure, a pull-down transistor is defined in a first active region 110. One pull-down transistor includes: a first source region 111, a first channel region 112, and a first drain region 113, and a first gate 130 covering the first channel region 112; where the first source region 111, the first channel region 112, and the first drain region 113 are in one first active region 110. Another pull-down transistor includes: a first source region 111, a first channel region 112, and a first drain region 113, and a second gate 140 covering the first channel region 112; where the first source region 111, the first channel region 112, and the first drain region 113 are in another first active region 110. A pull-up transistor is defined by the second active region 120. One pull-up transistor includes: a second source region 121, a second channel region 122, and a second drain region 123, and a first gate 130 covering the second channel region 122; where the second source region 121, the second channel region 122, and the second drain region 123 are in one second active region 120. Another pull-up transistor includes: a second source region 121, a second channel region 122, and a second drain region 123, and a second gate 140 covering the second channel region 122; where the second source region 121, the second channel region 122, and the second drain region 123 are in another second active region 120. In addition, a first conductive channel 150 is arranged in a substrate 100, such that a space required for wiring in a subsequent process can be reduced. In an example, the first conductive channel 150 is used to substitute for a supply voltage. In this way, a space originally used for wiring for a supply voltage can be used for the layout of another structure, for example, a layout space of word lines can be increased, such that a resistance of the word lines can be reduced, and a capability of the word lines to transfer an electrical signal can be improved, thereby reducing a delay of the semiconductor structure.

Another embodiment of the present disclosure further provides a manufacturing method of a semiconductor structure. The manufacturing method of a semiconductor structure provided by another embodiment of the present disclosure is described below with reference to the accompanying drawings. It should be noted that, for parts the same as or similar to those in the foregoing embodiment, reference may be made to the corresponding description in the foregoing embodiment, and details are not described again hereinafter.

Referring to FIG. 5 to FIG. 8 and FIG. 2, FIG. 5 to FIG. 8 and FIG. 2 are schematic structural diagrams corresponding to steps of a manufacturing method of a semiconductor structure according to an embodiment of the present disclosure.

Figures 5, 6:
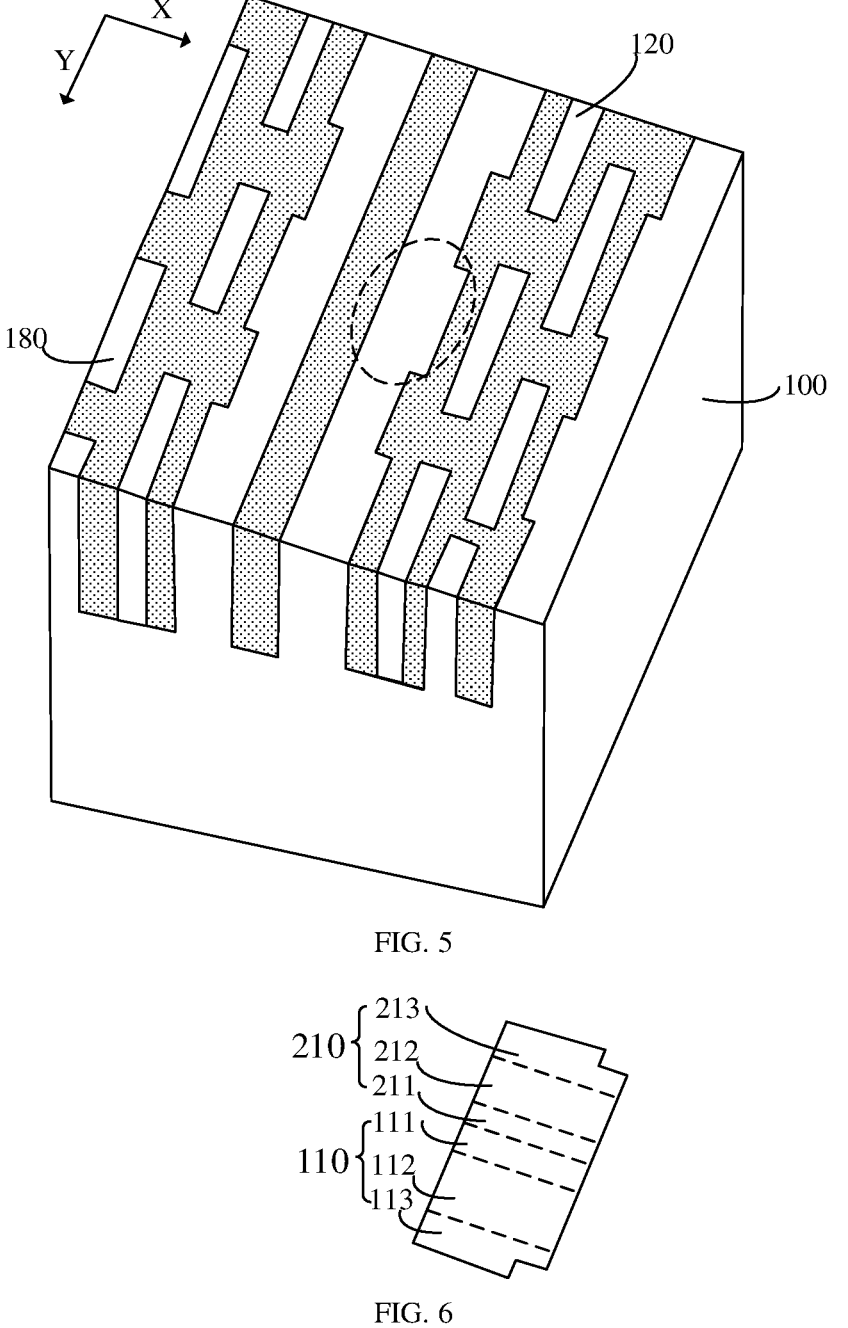
FIG. 5 to FIG. 14 are schematic structural diagrams corresponding to steps of a manufacturing method of a semiconductor structure according to an embodiment of the present disclosure.

In some embodiments, referring to FIG. 5 and FIG. 6, where FIG. 6 is a partially enlarged schematic diagram within a dashed line in FIG. 5, a substrate 100 is provided. The substrate 100 includes first active regions 110 arranged at intervals along a first direction X and two second active regions 120 arranged at intervals between adjacent first active regions 110. The first active regions 110 and the second active regions 120 all extend along a second direction Y. The first active region 110 defines a pull-down transistor 160. The second active region 120 defines a pull-up transistor 170. The first active regions 110 each have a first source region 111, a first channel region 112, and a first drain region 113 arranged along the second direction Y. The second active regions 120 each have a second source region 121, a second channel region 122, and a second drain region 123 arranged along the second direction Y.

In some embodiments, the substrate 100 further includes: third active regions 210. The third active regions 210 extend along the second direction Y and are arranged at intervals along the first direction X. The third active region 210 is connected to the first active region 110. The third active region 210 defines a memory transistor. The third active regions 210 each have a third source region 211, a third channel region 212, and a third drain region 213 arranged along the second direction Y. The formation of the third active regions 210 provides a process basis for the subsequent formation of a memory transistor, such that a static memory cell can be formed.

Figure 7:
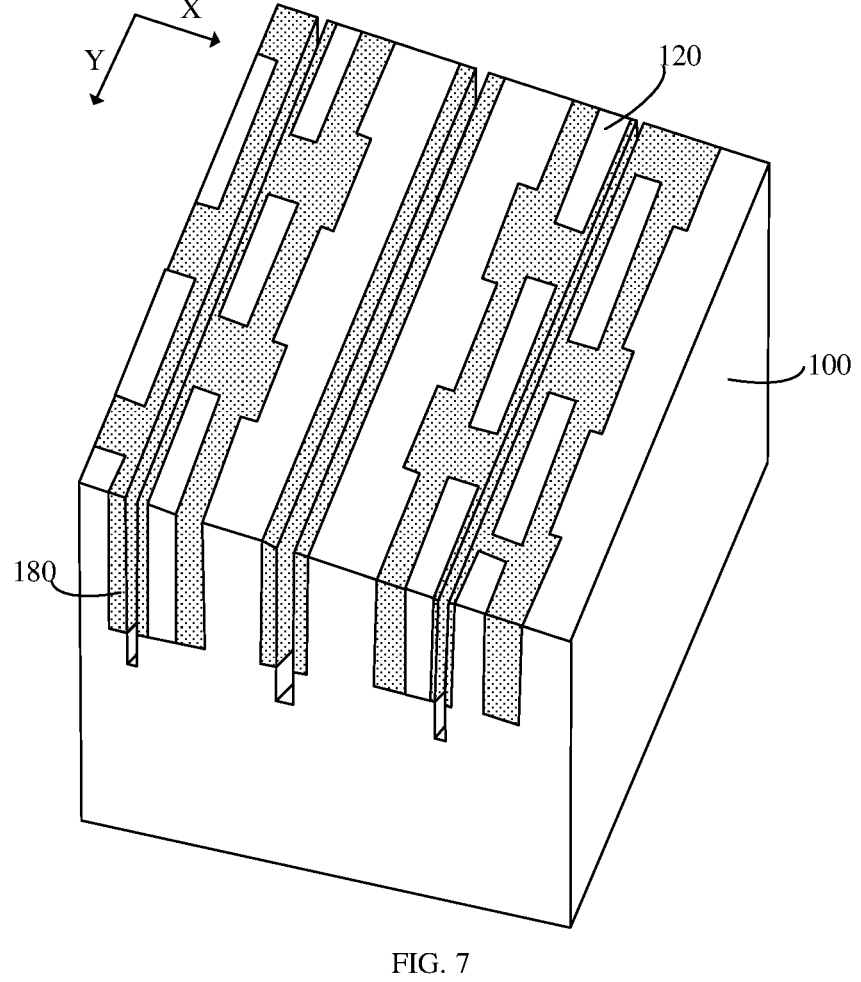
Figures 8, 9:
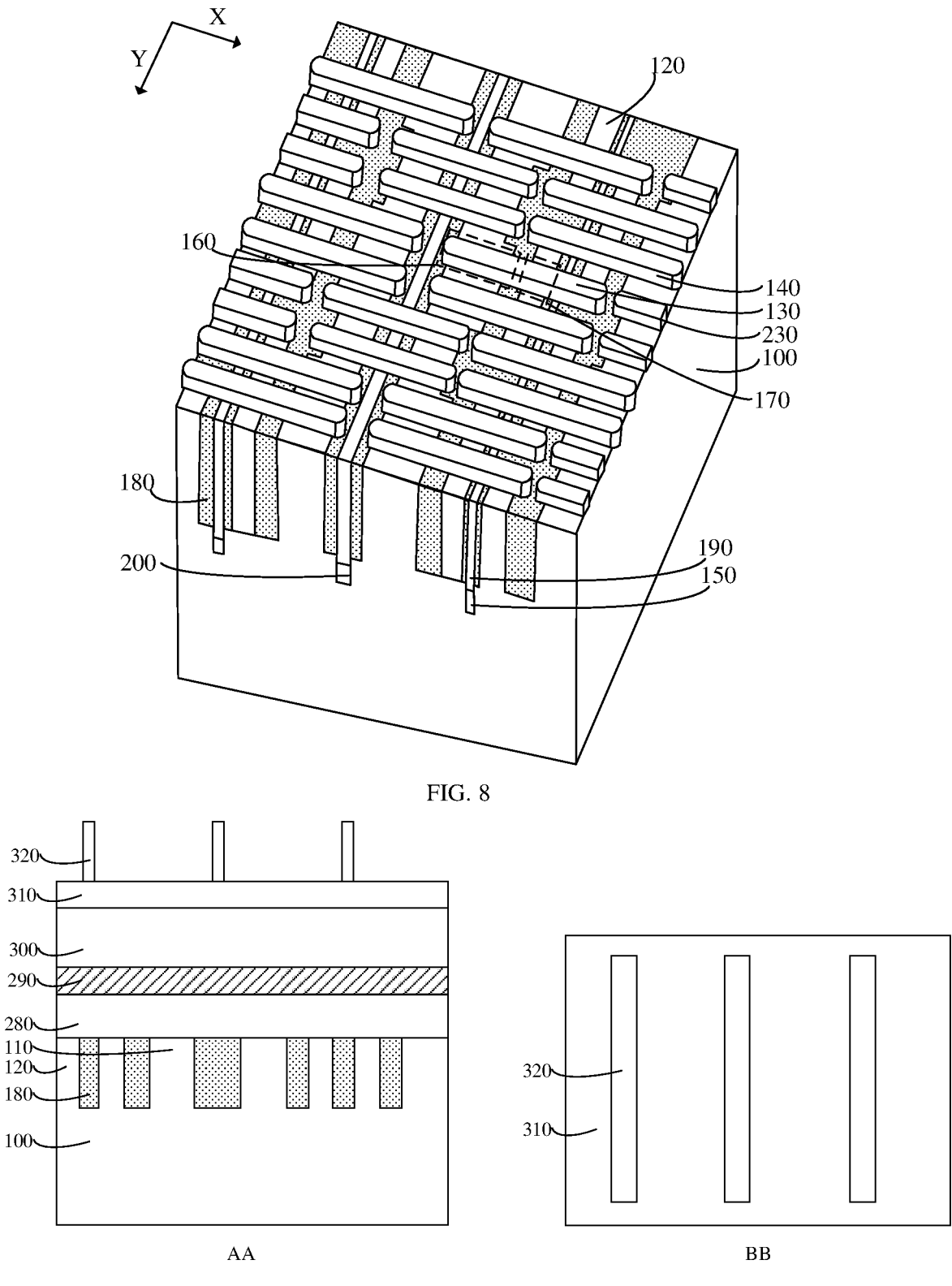

Referring to FIG. 7 and FIG. 8, a first conductive channel 150 extending along the second direction Y is formed; the first conductive channel 150 is located in the substrate 100 and located between adjacent second active regions 120, and is configured to electrically connect the second source regions 121 of the adjacent second active region 120. The formation of the first conductive channel 150 located in the substrate 100 can reduce a wiring space for a supply voltage during subsequent wiring, and a space originally used for wiring for the supply voltage can be used for the layout of another structure. In terms of word lines, for example, a layout space of the word lines can be increased, such that a resistance of the word lines can be reduced, and a capability of the word lines to transfer an electrical signal can be improved, thereby reducing a delay of the semiconductor structure.

Referring to FIG. 9 to FIG. 14, FIG. 9 to FIG. 14 are schematic structural diagrams corresponding to steps of forming a first conductive channel 150. The view AA is a cross-sectional view along the first direction X and perpendicular to a direction of a surface of the substrate 100. The view BB is a top view.

In some embodiments, the step of forming a first conductive channel 150 may include: forming an isolation structure 180, where the isolation structure 180 fills a gap between the first active region 110 and the second active region 120; patterning the isolation structure 180 to form a first groove 340, where the first groove 340 is located between the second active regions 120; and forming a first conductive channel 150, where the first conductive channel 150 is located in the first groove 340.

Referring to FIG. 9 to FIG. 13, the step of forming a graphics layer 360 may include: forming a first hard mask layer 280, where the first hard mask layer 280 is located on the surface of the isolation structure 180; forming a first intermediate layer 290, where the first intermediate layer 290 is located on a surface of the first hard mask layer 280; forming a first mask pattern 350, where the first mask pattern 350 is located on a surface of the first intermediate layer 290, and the first mask pattern 350 is with spacings along the first direction X; and etching the first hard mask layer 280 and the first intermediate layer 290 by taking the first mask pattern 350 as a mask, and taking the remaining part of the first hard mask layer 280 and the remaining part of the first intermediate layer 290 as the graphics layer 360. The formation of the graphics layer 360 as a mask for the subsequent formation of the first groove 340 can improve accuracy of the formed first groove 340.

Referring to FIG. 9, the step further includes: forming a second hard mask layer 300, where the second hard mask layer 300 is located on the surface of the first intermediate layer 290; forming a second intermediate layer 310, where the second intermediate layer 310 is located on a surface of the second hard mask layer 300; and forming a mask layer 320, where the mask layer 320 is located on a surface of the second intermediate layer 310.

In some embodiments, a material of the first hard mask layer 280 may be the same as that of the second hard mask layer 300, and a material of the first intermediate layer 290 may be the same as that of the second intermediate layer 310.

Figures 10, 11, 12:
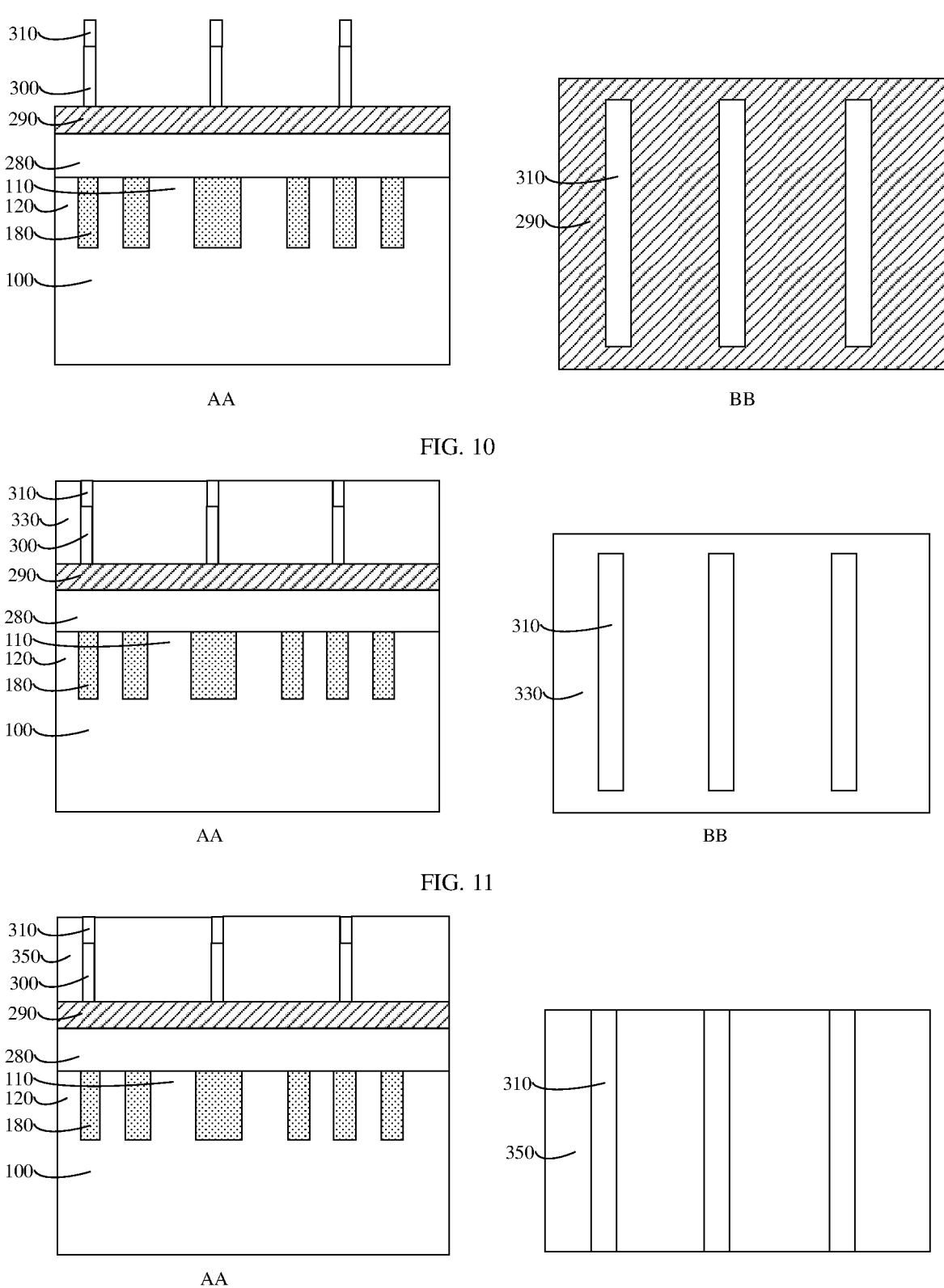

Referring to FIG. 10, the second hard mask layer 300 and the second intermediate layer 310 are etched by taking the mask layer 320 as a mask, to form the second hard mask layer 300 with spacings and the second intermediate layer 310 with spacings.

Referring to FIG. 11, a sidewall layer 330 is formed. The sidewall layer 330 surrounds sidewalls of the second hard mask layer 300 and the second intermediate layer 310.

Referring to FIG. 12, the sidewall layer 330 is etched to form the first mask pattern 350 with spacings along the first direction X. The formation of the first mask pattern 350 provides a mask for the subsequent formation of the graphics layer, such that accuracy of the formed graphics layer can be improved.

Figures 13, 14:
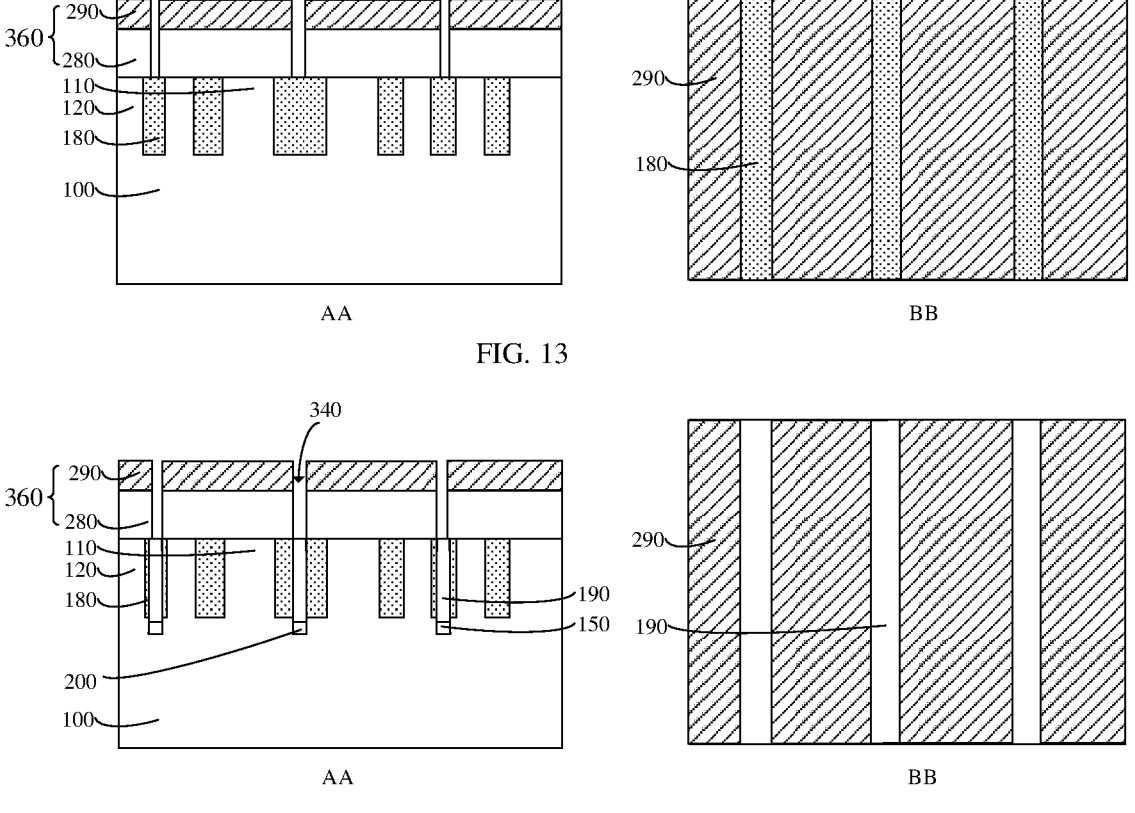

Referring to FIG. 13 and FIG. 14, a graphics layer 360 is formed, where the graphics layer 360 is located on a surface of the isolation structure 180; the isolation structure 180 is etched by taking the graphics layer 360 as a mask to form the first groove 340; and a first conductive channel 150 is formed, where the first conductive channel is located in the substrate 100.

In some embodiments, the manufacturing method further includes: forming a conductive layer 190. The conductive layer 190 is located on a top surface of the first conductive channel 150.

In some embodiments, the manufacturing method further includes: forming a second conductive channel 200. The second conductive channel 200 is located on an outer side of the first active region 110.

Still referring to FIG. 2, first gates 130 and second gates 140 are formed. The first gates 130 and the second gates 140 all extend along the first direction X. The first gate 130 covers the first channel region 112 of one of the first active regions 110 and the second channel region 122 of one of the second active regions 120. The second gate 140 covers the first channel region 112 of another one of the first active regions 110 and the second channel region 122 of another one of the second active regions 120. The first gate 130 and the second gate 140 can be formed as a gate structure of a pull-up transistor and a gate structure of a pull-down transistor.

The pull-down transistor 160 includes first pull-down transistors and second pull-down transistors. The first pull-down transistor includes: the first gate 130, the first channel region 112 of the first active region 110 that is covered by the first gate 130, and the first source region 111 and the first drain region 113 located on two sides of the first channel region 112. The second pull-down transistor includes: the second gate 140, the first channel region 112 of the another first active region 110 that is covered by the second gate 140, and the first source region 111 and the first drain region 113 located on two sides of the first channel region 112.

The first gate 130 covering the first active region 110 is used as a gate of the first pull-down transistor. The first source region 111 and the first drain region 113 located on the two sides of the first gate 130 are used as a source and a drain of the first pull-down transistor, respectively. The second gate 140 covering the first active region 110 is used as a gate of the second pull-down transistor. The first source region 111 and the first drain region 113 located on the two sides of the second gate 140 are used as a source and a drain of the second pull-down transistor, respectively.

In some embodiments, the pull-up transistor 170 includes first pull-up transistors and second pull-up transistors. The first pull-up transistor includes the first gate 130 and the second active region 120 covered by the first gate 130. The second pull-up transistor includes the second gate 140 and the second active region 120 covered by the second gate 140.

In some embodiments, before the first gates 130 and the second gates 140 are formed, the manufacturing method of a semiconductor structure further includes: forming a second conductive channel 200. The second conductive channel 200 extends along the second direction Y, and the second conductive channel 200 is located on an outer side of the first active region 110 away from the second active region 120 and is configured to electrically connect the first gate 130. Through the formation of the second conductive channel 200, a wiring space required for subsequent formation of a semiconductor structure can be reduced. Through the arrangement of the second conductive channel 200, a space used for the layout of a grounding conductor can be used for the layout of another structure. In terms of bit lines, for example, a space for the subsequent layout of the bit lines can be increased, areas of the bit lines can be increased, and a resistance of the bit lines can be reduced by increasing the areas of the bit lines. In addition, a capability of the bit lines to transfer an electrical signal can be improved, thereby reducing a delay of the semiconductor structure.

The first conductive channel 150 and the second conductive channel 200 are formed to provide a supply voltage and a ground voltage to the static memory cell, such that a size of the semiconductor structure can be reduced by reducing cabling spaces for the supply voltage and the ground voltage in the subsequent wiring process, and a cabling space of another structure can be increased, for example, a cabling space for word lines or bit lines can be increased, thereby further reducing a resistance of the word lines or the bit lines, and improving a conduction rate of the word lines or the bit lines.

In some embodiments, a process of forming the first gates 130 and the second gates 140 further includes: forming third gates 230, where the third gate 230 covers the third channel region 212. A gate of a memory transistor 220 can be formed by forming the third gate 230, thereby providing a process basis for forming the memory transistor 220.

The third source region 211 of the third active region 210 is used as a source of the memory transistor 220. The third drain region 213 is used as a drain of the memory transistor 220. The third gate covering the third channel region 212 is used as a gate of the memory transistor 220. A bit line voltage can be accessed through the memory transistor 220.

In this embodiment of the present disclosure, the first active region 110 is formed, the formed first active region 110 defines the pull-down transistor 160, the second active region 120 is formed, the second active region 120 defines the pull-up transistor 170, the formed first gate 130 and the formed second gate 140 are respectively used as the gate of the pull-up transistor 170 and/or the gates of the pull-down transistor 160, and an electrical signal is provided to the pull-down transistor 160 by forming the first conductive channel 150. In this way, a wiring space required during subsequent wiring for the semiconductor structure can be reduced, and a larger layout space for the layout of another structure can be provided.

Those skilled in the art can understand that the above implementations are specific embodiments for implementing the present disclosure. In practical applications, various changes may be made to the above embodiments in terms of form and details without departing from the spirit and scope of the embodiments of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A semiconductor structure, comprising:
   a substrate, wherein the substrate comprises first active regions arranged at intervals along a first direction and two second active regions arranged at intervals between adjacent first active regions, the first active regions and the second active regions all extend along a second direction, the first active region defines a pull-down transistor, the second active region defines a pull-up transistor; the first active region has a first source region, a first channel region, and a first drain region arranged along the second direction; and the second active region has a second source region, a second channel region, and a second drain region arranged along the second direction;

first gates and second gates, wherein the first gates and the second gates all extend along the first direction, the first gate covers the first channel region of one of the first active regions and the second channel region of one of the second active regions, and the second gate covers the first channel region of another one of the first active regions and the second channel region of another one of the second active regions; and a first conductive channel extending along the second direction, wherein the first conductive channel is located in the substrate and located between adjacent second active regions, and is configured to electrically connect the second source regions of the adjacent second active regions.

2. The semiconductor structure according to claim 1, further comprising: a second conductive channel, wherein the second conductive channel extends along the second direction, and the second conductive channel is located on an outer side of the first active region away from the second active region and is configured to electrically connect the first gate.

3. The semiconductor structure according to claim 2, further comprising:

third active regions, wherein the third active regions extend along the second direction and are arranged at intervals along the first direction, the third active region is connected to the first active region, the third active region defines a memory transistor; and the third active region has a third source region, a third channel region, and a third drain region arranged along the second direction; and third gates, wherein the third gate covers the third channel region.

4. The semiconductor structure according to claim 3, wherein two of the first active regions arranged at intervals, two of the second active regions between the two of the first active regions, two of the third active regions, two of the first gates, two of the second gates, and two of the third gates constitute a static memory cell; and the static memory cells arranged along the second direction share the first conductive channel.

5. The semiconductor structure according to claim 2, further comprising: an interconnect layer, wherein the interconnect layer is located above the substrate; and a conductive plug, wherein the conductive plug is located between the interconnect layer and the first conductive channel and is configured to electrically connect the first conductive channel and the interconnect layer.

6. The semiconductor structure according to claim 5, wherein the conductive plug is further located between the interconnect layer and the second conductive channel and is configured to electrically connect the second conductive channel and the interconnect layer.

7. The semiconductor structure according to claim 1, wherein the pull-down transistor and the pull-up transistor constitute a common gate structure.

8. The semiconductor structure according to claim 1, wherein distances from the first conductive channel to two of the first active regions adjacent to the first conductive channel are equal.

9. The semiconductor structure according to claim 1, wherein the pull-up transistor comprises a first pull-up transistor and a second pull-up transistor, the first pull-up transistor comprises the first gate and the second active region covered by the first gate, the second pull-up transistor region covered by the first gate, the second pull-up transistor comprises the second gate and the second active region covered by the second gate, and the first pull-up transistor and the second pull-up transistor are center-symmetrically distributed.

10. A manufacturing method of a semiconductor structure, comprising:

providing a substrate, wherein the substrate comprises first active regions arranged at intervals along a first direction and two second active regions arranged at intervals between adjacent first active regions, the first active regions and the second active regions all extend along a second direction, the first active region defines a pull-down transistor, the second active region defines a pull-up transistor; the first active region has a first source region, a first channel region, and a first drain region arranged along the second direction; and the second active region has a second source region, a second channel region, and a second drain region arranged along the second direction;

forming a first conductive channel extending along the second direction, wherein the first conductive channel is located in the substrate and located between adjacent second active regions, and is configured to electrically connect the second source regions of the adjacent second active regions; and forming first gates and second gates, wherein the first gates and the second gates all extend along the first direction, the first gate covers the first channel region of one of the first active regions and the second channel region of one of the second active regions, and the second gate covers the first channel region of another one of the first active regions and the second channel region of another one of the second active regions.

11. The manufacturing method of a semiconductor structure according to claim 10, wherein the step of forming a first conductive channel comprises:

forming an isolation structure, wherein the isolation structure fills a gap between the first active region and the second active region;

patterning the isolation structure to form a first groove, wherein the first groove is located between the second active regions; and forming a first conductive channel, wherein the first conductive channel is located in the first groove.

12. The manufacturing method of a semiconductor structure according to claim 11, wherein the step of forming the first groove comprises:

forming a graphics layer, wherein the graphics layer is located on a surface of the isolation structure; and etching the isolation structure by taking the graphics layer as a mask, to form the first groove.

13. The manufacturing method of a semiconductor structure according to claim 12, wherein the step of forming a graphics layer comprises:

forming a first hard mask layer, wherein the first hard mask layer is located on the surface of the isolation structure;

forming a first intermediate layer, wherein the first intermediate layer is located on a surface of the first hard mask layer;

forming a first mask pattern, wherein the first mask pattern is located on a surface of the first intermediate layer, and the first mask pattern is with spacings along the first direction; and etching the first hard mask layer and the first intermediate layer by taking the first mask pattern as a mask, and taking a remaining part of the first hard mask layer and a remaining part of the first intermediate layer as the graphics layer.

14. The manufacturing method of a semiconductor structure according to claim 13, wherein the step of forming the first mask pattern comprises:

forming a second hard mask layer, wherein the second hard mask layer is located on the surface of the first intermediate layer;

forming a second intermediate layer, wherein the second intermediate layer is located on a surface of the second hard mask layer;

forming a mask layer, wherein the mask layer is located on a surface of the second intermediate layer;

etching the second hard mask layer and the second intermediate layer by taking the mask layer as a mask, to form the second hard mask layer with spacings and the second intermediate layer with spacings;

forming a sidewall layer, wherein the sidewall layer surrounds sidewalls of the second hard mask layer and the second intermediate layer; and etching the sidewall layer to form the first mask pattern with spacings along the first direction.

15. The manufacturing method of a semiconductor structure according to claim 10, wherein before the first gates and the second gates are formed, the manufacturing method of a semiconductor structure further comprises:

forming a second conductive channel, wherein the second conductive channel extends along the second direction, and the second conductive channel is located on an outer side of the first active region away from the second active region and is configured to electrically connect the first gate.

16. The manufacturing method of a semiconductor structure according to claim 10, wherein the substrate further comprises: third active regions, wherein the third active regions extend along the second direction and are arranged at intervals along the first direction, the third active region is connected to the first active region, the third active region defines a memory transistor; and the third active region has a third source region, a third channel region, and a third drain region arranged along the second direction; and a process of forming the first gates and the second gates further comprises: forming third gates, wherein the third gate covers the third channel region.

* * * * *